United States Patent
De Graaf et al.

(10) Patent No.: US 7,468,779 B2
(45) Date of Patent: Dec. 23, 2008

(54) LITHOGRAPHIC APPARATUS AND DEVICE MANUFACTURING METHOD

(75) Inventors: Roelof Frederik De Graaf, Veldhoven (NL); Sjoerd Nicolaas Lambertus Donders, s-Hertogenbosch (NL); Christiaan Alexander Hoogendam, Veldhoven (NL); Hans Jansen, Eindhoven (NL); Martinus Hendrikus Antonius Leenders, Rotterdam (NL); Jeroen Johannes Sophia Maria Mertens, Duizel (NL); Bob Streefkerk, Tilburg (NL); Jan-Gerard Cornelis Van Der Toorn, Eindhoven (NL); Michel Riepen, Bergschenhoek (NL)

(73) Assignee: ASML Netherlands B.V., Veldhoven (NL)

( * ) Notice: Subject to any disclaimer, the term of this patent is extended or adjusted under 35 U.S.C. 154(b) by 79 days.

(21) Appl. No.: 11/167,563

(22) Filed: Jun. 28, 2005

(65) Prior Publication Data
US 2006/0290908 A1    Dec. 28, 2006

(51) Int. Cl.
*G03B 27/42* (2006.01)
*G03B 27/52* (2006.01)
*G03B 27/32* (2006.01)
*G03C 5/00* (2006.01)

(52) U.S. Cl. .................... 355/53; 355/30; 355/72; 355/77; 430/30

(58) Field of Classification Search ............ 355/30, 355/53, 72, 77; 430/30
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,825,043 A | 10/1998 | Suwa | 250/548 |
| 5,900,354 A | 5/1999 | Batchelder | 430/395 |

(Continued)

FOREIGN PATENT DOCUMENTS

DE            206 607            2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Alan A Mathews
(74) *Attorney, Agent, or Firm*—Pillsbury Winthrop Shaw Pittman, LLP

(57) ABSTRACT

A lithographic projection apparatus is disclosed in which measures are taken to prevent or reduce the presence of bubbles in liquid through which the projection beam radiates. This may be done, for example, by ensuring that a gap between a substrate and a substrate table is filled with immersion liquid or by causing a localized flow radially outwardly from the optical axis in the vicinity of the edge of the substrate.

33 Claims, 4 Drawing Sheets

U.S. PATENT DOCUMENTS

| | | |
|---|---|---|
| 6,191,429 B1 | 2/2001 | Suwa .................. 250/548 |
| 6,236,634 B1 | 5/2001 | Lee et al. ................ 369/112 |
| 6,600,547 B2 | 7/2003 | Watson et al. ............ 355/30 |
| 6,603,130 B1 | 8/2003 | Bisschops et al. ........ 250/492.1 |
| 2002/0020821 A1 | 2/2002 | Van Santen et al. ......... 250/492 |
| 2002/0163629 A1 | 11/2002 | Switkes et al. ............ 355/53 |
| 2003/0123040 A1 | 7/2003 | Almogy ................... 355/69 |
| 2004/0000627 A1 | 1/2004 | Schuster ................. 250/201.2 |
| 2004/0075895 A1 | 4/2004 | Lin ........................ 359/380 |
| 2004/0114117 A1 | 6/2004 | Bleeker ................... 355/53 |
| 2004/0136494 A1 | 7/2004 | Lof et al. |
| 2004/0160582 A1 | 8/2004 | Lof et al. ................... 355/30 |
| 2004/0165159 A1 | 8/2004 | Lof et al. ................... 355/30 |
| 2004/0207824 A1 | 10/2004 | Lof et al. |
| 2004/0211920 A1 | 10/2004 | Derksen et al. ......... 250/492.1 |
| 2004/0239954 A1 | 12/2004 | Bischoff ................... 356/635 |
| 2004/0257544 A1 | 12/2004 | Vogel et al. ............... 355/30 |
| 2004/0263809 A1 | 12/2004 | Nakano .................... 355/30 |
| 2005/0007569 A1 | 1/2005 | Streefkerk et al. |
| 2005/0018155 A1 | 1/2005 | Cox et al. ................. 355/30 |
| 2005/0024609 A1 | 2/2005 | De Smit et al. .......... 355/18 |
| 2005/0030497 A1 | 2/2005 | Nakamura ................ 355/30 |
| 2005/0046813 A1 | 3/2005 | Streefkerk et al. ......... 355/30 |
| 2005/0046934 A1 | 3/2005 | Ho et al. .................. 359/380 |
| 2005/0052632 A1 | 3/2005 | Miyajima ................. 355/53 |
| 2005/0088635 A1* | 4/2005 | Hoogendam et al. ....... 355/30 |
| 2005/0094116 A1 | 5/2005 | Flagello et al. ............ 355/53 |
| 2005/0094125 A1 | 5/2005 | Arai ........................ 355/72 |
| 2005/0122505 A1 | 6/2005 | Miyajima ................. 355/72 |
| 2005/0132914 A1 | 6/2005 | Mulkens et al. .......... 101/463.1 |
| 2005/0134817 A1 | 6/2005 | Nakamura ................ 355/53 |
| 2005/0140948 A1 | 6/2005 | Tokita ...................... 355/30 |
| 2005/0146693 A1 | 7/2005 | Ohsaki ..................... 355/30 |
| 2005/0146694 A1 | 7/2005 | Tokita ...................... 355/30 |
| 2005/0151942 A1 | 7/2005 | Kawashima .............. 355/30 |
| 2005/0200815 A1 | 9/2005 | Akamatsu ................. 353/53 |
| 2005/0213065 A1 | 9/2005 | Kitaoka .................... 355/53 |
| 2005/0213066 A1 | 9/2005 | Sumiyoshi ................ 355/53 |
| 2005/0219489 A1 | 10/2005 | Nei et al. .................. 355/53 |
| 2005/0233081 A1 | 10/2005 | Tokita ...................... 427/256 |
| 2005/0259233 A1 | 11/2005 | Streefkerk et al. .......... 355/53 |
| 2005/0270506 A1 | 12/2005 | Streefkerk et al. .......... 355/53 |
| 2006/0215131 A1 | 9/2006 | Van Der Toorn et al. ..... 355/30 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 298 A2 | 5/2004 |
| EP | 1 420 300 A2 | 5/2004 |
| EP | 1 477 856 A1 | 11/2004 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, *J. Microlith., Microfab., Microsyst.* 1(1):7-12 (2002).

* cited by examiner

Fig. 8
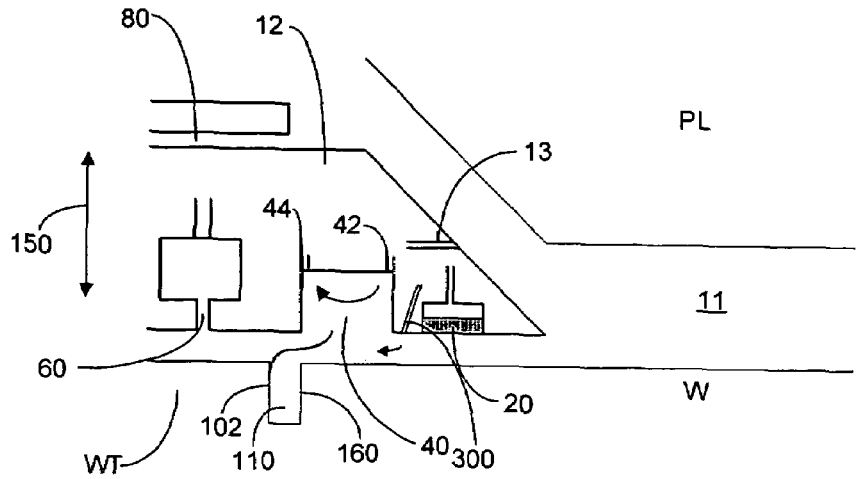
Fig. 9
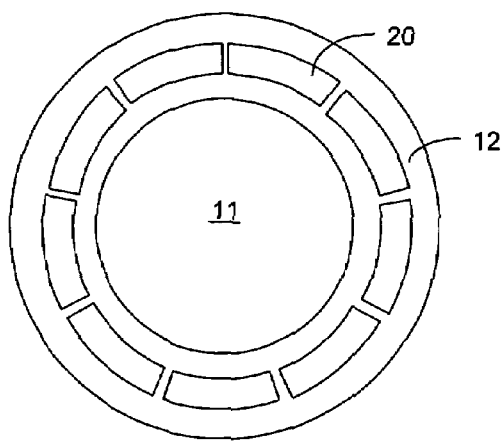
Fig. 10a
Fig. 10b
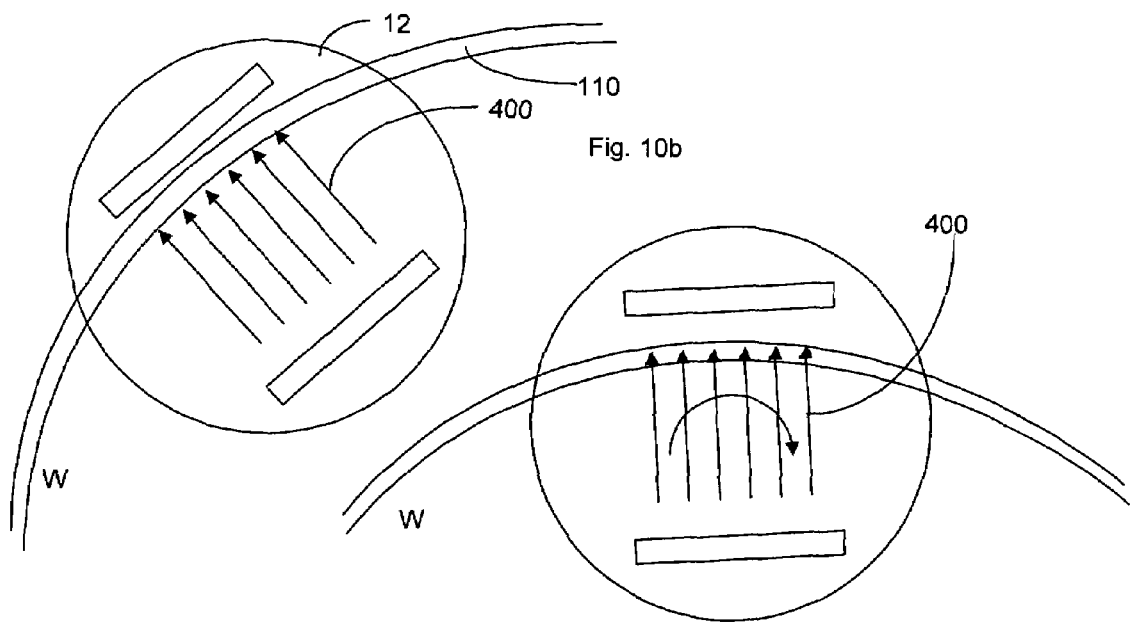

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (Ics). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A problem with immersion lithography is the presence of bubbles in the immersion liquid. If the path of the projection beam passes through areas of immersion liquid which contain bubbles this can deleteriously affect the quality of the patterned imaged projected onto the substrate.

SUMMARY

It is desirable to reduce the presence of bubbles in a part of the immersion liquid through which the projection beam will pass.

According to an aspect of the invention, there is provided a lithographic projection apparatus arranged to project a radiation beam onto a substrate or another object through a liquid which is confined to a space by a barrier member, the apparatus comprising a controller adapted to cause a movement of a part of the barrier member substantially parallel to the direction of the optical axis of the apparatus when the part of the barrier member, the space or both, is positioned above or adjacent an edge of the substrate or the another object.

According to an aspect of the invention, there is provided a lithographic projection apparatus arranged to project a radiation beam onto a substrate or another object through a liquid which is confined to a space by a barrier member, the apparatus comprising a controller adapted, when the barrier member, the space, or both, is positioned above or adjacent an edge of the substrate or another object, to cause or increase a flow of liquid in the proximity of the edge in a direction away from the optical axis of the apparatus.

According to an aspect of the invention, there is provided a lithographic projection apparatus arranged to project a radiation beam onto a substrate or another object through liquid which is confined to a space by a barrier member, wherein a liquid inlet is provided on a bottom surface of the barrier member radially inwardly of an outlet, wherein the inlet is shaped to direct exiting liquid at least partly radially outwardly such that the exiting liquid is effective substantially to prevent bubbles formed in the liquid at a position radially outwardly of the inlet from moving radially inwardly of the inlet.

According to an aspect of the invention, there is provided a lithographic projection apparatus arranged to project a radiation beam onto a substrate through a liquid which is confined to a space by a barrier member, the barrier member comprising a contactless seal configured to extend between the barrier member and a substrate table configured to support the substrate and wherein the seal is configured to completely surround the substrate in a loop.

According to an aspect of the invention, there is provided a device manufacturing method using a lithographic projection apparatus comprising projecting a patterned beam of radiation through a liquid confined to a space by a barrier member onto a substrate, moving the substrate such that part of the barrier member, the space, or both, is positioned above or adjacent an edge of the substrate, and moving the barrier member in a direction substantially parallel to an optical axis of the apparatus.

According to an aspect of the invention, there is provided a device manufacturing method using a lithographic projection apparatus comprising projecting a patterned beam of radiation through a liquid confined to a space by a barrier member onto a substrate, moving the substrate such that the barrier member, the space, or both, is positioned above or adjacent an edge of the substrate and causing or increasing a flow of liquid in a proximity of the edge in a direction away from an optical axis of the apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 depicts schematically a liquid confinement system according to an embodiment of the present invention;

FIG. 9 depicts, in plan, a liquid confinement system according to an embodiment of the present invention; and FIG. 10 depicts a further embodiment of the present invention.

DETAILED DESCRIPTION

Figure 1:
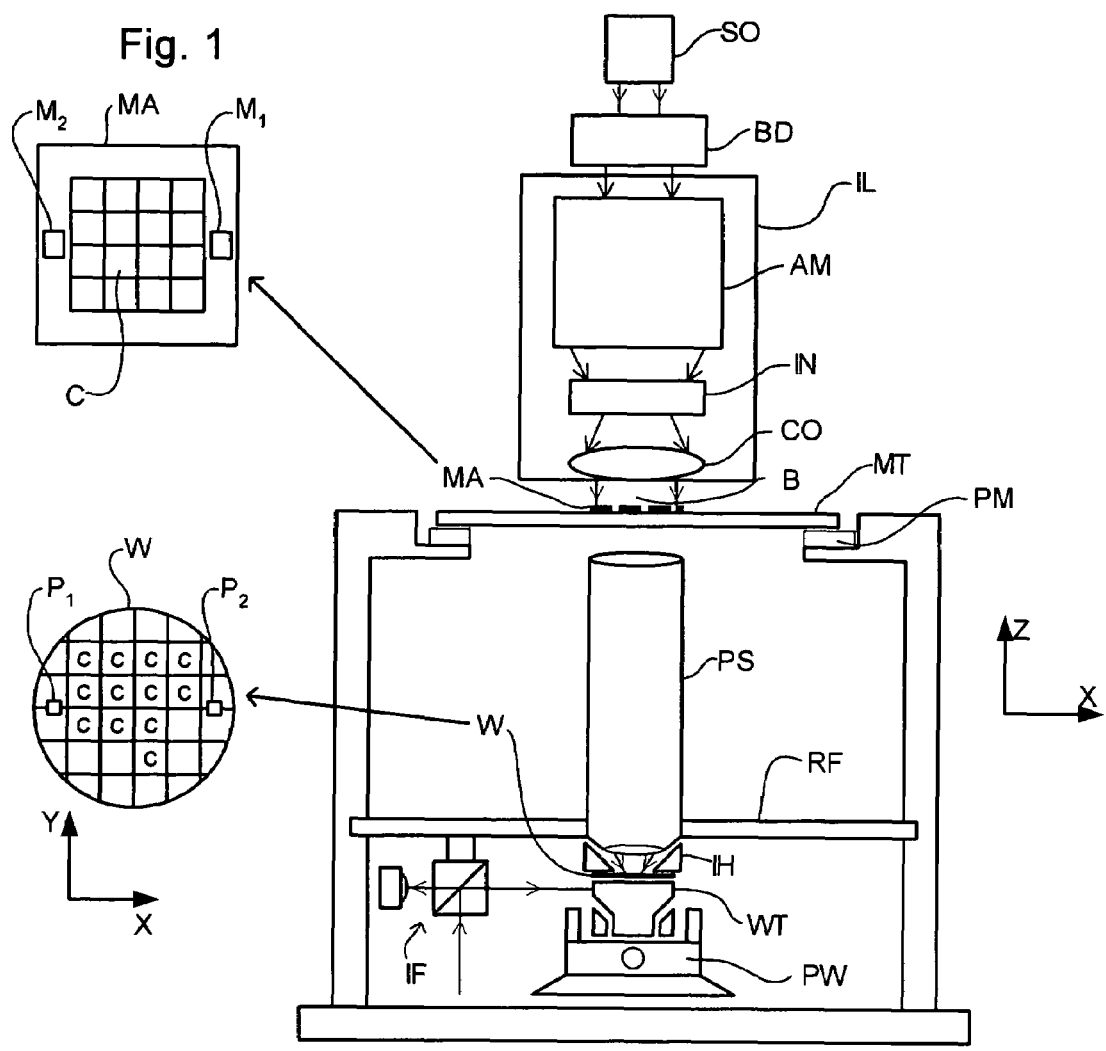
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively)

of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
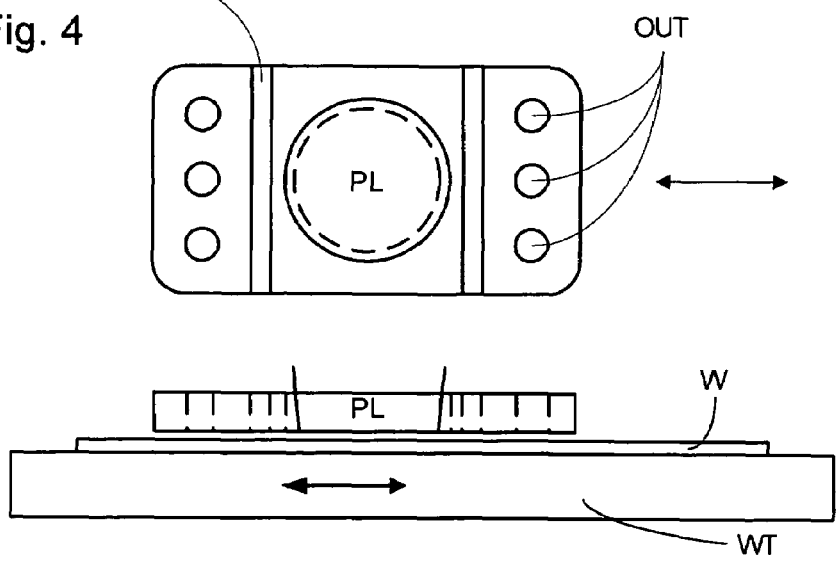
FIG. 4 depicts a another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another solution which has been proposed is to provide the liquid supply system with a barrier member which extends along at least a part of a boundary of the space between the final element of the projection system and the substrate table. The barrier member is substantially stationary relative to the projection system in the XY plane though there may be some relative movement in the Z direction (in the direction of the optical axis). In an embodiment, a seal is formed between the barrier member and the surface of the substrate. The seal may be a contactless seal such as a gas seal. Such a system is disclosed in U.S. patent application publication no. US 2004-0207824 and European patent application publication no. EP 1420298, each hereby incorporated in its entirety by reference, and illustrated in FIG. 5.

Figure 5:
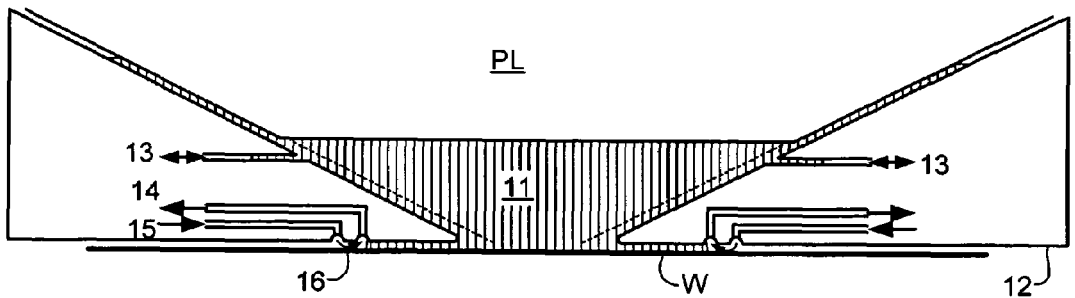
FIG. 5 depicts another liquid supply system.

As shown in FIG. 5, an immersion liquid is confined to a space 11 between the final element of the projection system PL and the substrate W. The liquid confinement system comprises a barrier member 12 which provides an inner surface which defines the space 11. Immersion liquid is provided to the space 11 through inlets/outlets 13 and a contactless seal is formed between a bottom surface of the barrier member 12 and the substrate W using a flow of gas 16 between a gas inlet 15 and a gas/immersion liquid outlet 14.

A problem in immersion lithography is the presence of bubbles in the immersion liquid in the space 11. The presence of bubbles in this space can have a detrimental effect on the imaging quality of the apparatus. A particularly problematic source of bubbles may be present at the edge of the substrate W. When an edge of the substrate is to be imaged, the substrate is moved to a position such that one of its edges is present below the space 11. Measures may be taken to make the gap 110 between the edge of the substrate W and the substrate table WT on which the substrate is positioned as small as possible and to ensure that the top surface of the substrate W and the substrate table WT are co-planar. However, in order to account for tolerances in both the size of the substrate W and to ease handling of the substrate W, a small gap 110 will almost always exist. The difficulty with this gap is that gas (e.g., air) can be entrapped in the gap and, when the substrate W edge moves under the space 11 which contains immersion liquid, bubbles can be released into the immersion liquid from the gap 110 by interaction with the meniscus and/or by free floating bubbles out of the gap. This problem may also exist for other components on the substrate table which may need to be imaged through the immersion liquid such as a sensor, including, for example, a transmission image sensor. An embodiment of the present invention will be described in relation to the substrate W edge, but it is equally applicable to any other object over whose edge the space 11 or barrier member 12 passes e.g. a gutter around a closing plate (which is used to contain immersion liquid under the projection system during, for example, substrate swap).

The problem of the edge of the substrate W being a bubbles source is particularly relevant to a liquid confinement system in which the space 11 filled with immersion liquid is, in plan, smaller in area than the substrate W. Such a liquid confinement system is illustrated in all of the Figures and supplies immersion liquid to only a localized area of the substrate.

Figure 2:
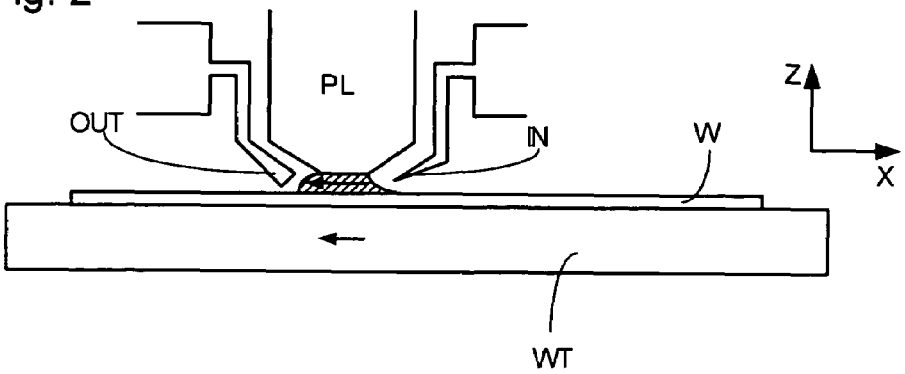
FIGS. 2 and 3 depict a liquid supply system for use in a lithographic projection apparatus.
Figure 3:
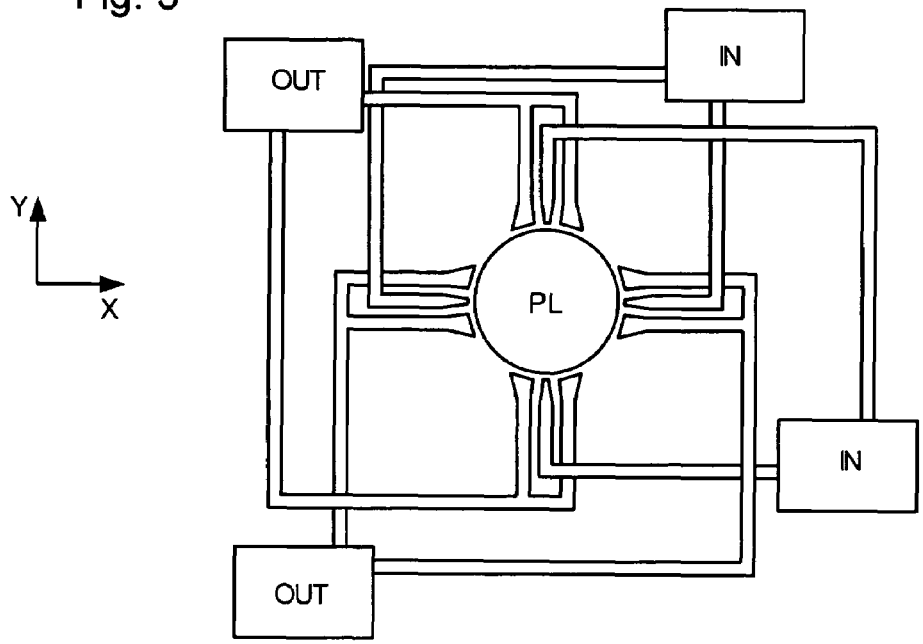
Figure 6:
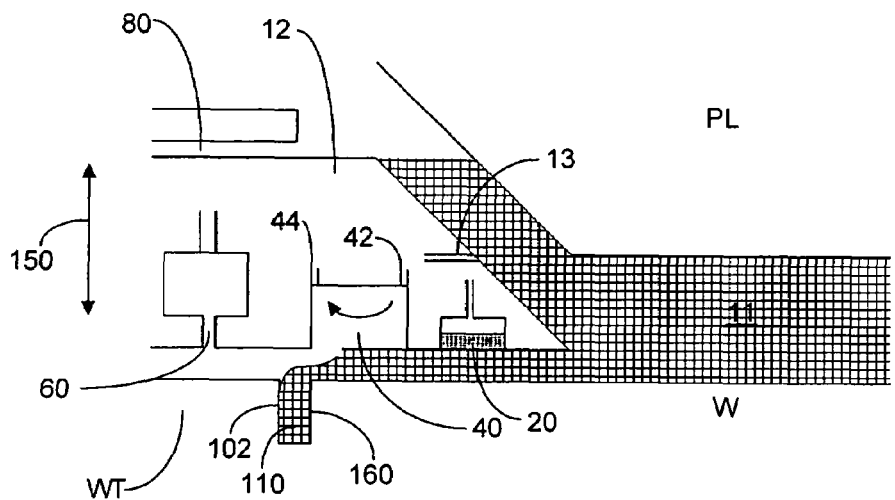
FIG. 6 depicts schematically an embodiment of the present invention.

In FIG. 6 one way of reducing or minimizing the effect of bubbles is illustrated on a barrier member 12 of the sort described in U.S. patent application Ser. No. 11/098,615, filed 5 Apr. 2005, which is hereby incorporated in its entirety. This type of barrier member 12 comprises, from its radially inner most edge on its bottom surface, a liquid removal device 20 such as the one disclosed in U.S. patent application Ser. No. 10/921,348, filed 19 Aug. 2004, which is hereby incorporated in its entirety. Radially outwardly of the liquid removal device 20 is provided a recess 40 which is connected through an inlet 42 to the atmosphere and via an outlet 44 to a low pressure source such that a flow of gas from inlet 42 to outlet 44 (radially outwardly) is developed. Radially outwardly of recess 40 is a gas knife 60. The arrangement of these three items on the bottom surface of the barrier member 12 is described in detail in U.S. patent application US 60/643,626, filed 14 Jan. 2005, which is hereby incorporated in its entirety. Immersion liquid is provided to the space through an inlet 13 in an inner side wall of the barrier member 12 which defines the space. An outlet 80 is provided towards the top of the inner surface of the barrier member 12 and immersion liquid can flow from the space out through the outlet 80 when the level of liquid in the space is greater than a desired height. The inlet 13 and outlet 80 are illustrated schematically only. Any type of inlet/outlet can be used including those illustrated in FIGS. 2-4 but a desired version is illustrated in U.S. patent application US60/643,626.

As will be clear, during imaging of the substrate W or another object, such as a sensor, with the projection beam PB, the substrate table WT is moved relative to the projection system PL. The barrier member 12 is held generally stationery to the projection system PL though may be actuated in the Z direction and tilted around the $R_x$ and $R_y$ axes in order to maintain a substantially constant distance to the top surface of the substrate W, substrate table WT or sensor. It will be appreciated that the substrate table WT will shift the substrate W in the X and Y directions so that all areas can be imaged and will also, during imaging, move the substrate W up and down in the Z direction and tilt it in the $R_x$ and $R_y$ axes to account for local topographic variations in the top surface of the substrate W. A controller controls the position of the barrier member 12 in order to substantially maintain constant the height of the barrier member 12 relative to the substrate W. Such an arrangement is disclosed European patent application EP-A-1,477,856 and U.S. patent application Ser. No. 10/844,575, filed May 13, 2004, both of which are hereby incorporated in their entirety. In an embodiment of the present invention, this controller is adapted to apply further movements to the barrier member 12 in order to reduce the chances of bubbles emerging from the gap 110 between an edge 100 of the substrate W and an edge 102 of the substrate table WT. The same or a different controller can control the supply of immersion liquid and/or gas to the barrier member 12.

The first possible type of such movement is illustrated in FIG. 6 in which arrow 150 shows that the controller causes additional movement of the barrier member 12 in the Z direction when the barrier member 12 or the space 11 is above or adjacent to the gap 110 or when the gap 110 is being approached.

In an embodiment, the barrier member 12 is lowered towards the substrate W further than it would normally be such that immersion liquid is squeezed into the gap 110. This movement may be followed by an upward motion to return the barrier member 12 to its original position or to move it to a position above where it would normally be. This cycle may be repeated so that the barrier member 12 oscillates in the Z direction as illustrated by arrow 150 but usually this is not necessary and one cycle each time the barrier member 12 crosses the edge is normally adequate i.e. it oscillates at the same frequency as the die scan frequency which is about 1.5 Hz and between 1 and 8 times per row depending on the die layout and the row scan frequency is about 0.1 to 0.5 Hz. The oscillation is not necessarily periodic when it is synchronized with the substrate table WT motion. Typically the barrier member 12 is positioned about 100 μm above the substrate W. This is the so called "fly height" and this can be in the range of perhaps 75 μm to 1 mm. The lowering motion of the barrier member 12 is, in an embodiment, from the normal fly height to within about 30 to 50 μm of the substrate. The speed of the cycle is related to the scan speed of the substrate W and the width of the gap 110. Typically the cycle period of the barrier member in the Z direction is about 0.5 s with a substrate W scan speed of 500 mm/s. Typical ranges for the cycle period is 0.1 and 50 ms.

In the above description it is assumed that the barrier member 12 moves up and down in the Z direction uniformly (i.e. without any rotation around the $R_x$ and $R_y$ directions). However, this is not necessarily the case and movement of the barrier member 12 in the Z direction can be arranged such that the maximum movement occurs to the part of the barrier member 12 in the position above or adjacent the gap 110 and that those parts distant from the gap only move slightly i.e. a tilt of the barrier member 12 is induced.

In an embodiment, only an upwards movement of the barrier member 12 in the Z direction is added to any other movement required for the normal functioning of a barrier member 12 so that the barrier member 12 moves away from the substrate or substrate table or sensor and this acts to stabilize a meniscus 160 of the immersion liquid below the barrier member 12 at the edge of the space 11 and which is influenced by the gas flow in the recess 40. This may be accomplished by uniform movement or by tilting as described above. The upward movement reduces the speed of gas from the gas knife thereby reducing disturbances on the meniscus and also reduces viscous forces on the meniscus so that the gap can more easily be filled by capillary action.

Figure 7:
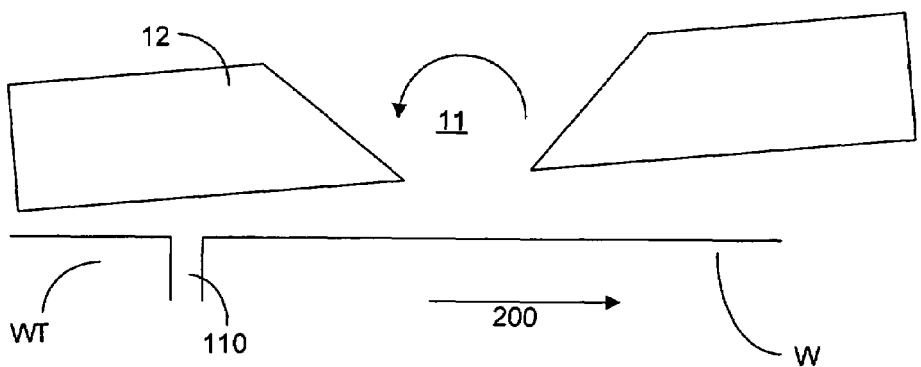
FIG. 7 depicts schematically another embodiment of the present invention.

FIG. 7 illustrates an embodiment in which, as a gap 110 between a substrate W or another object and the substrate table WT approaches the space 11 (i.e. the substrate table WT moves in direction 200 illustrated in FIG. 7), the barrier member 12 is tilted towards the approaching gap 110 so that immersion liquid is squeezed into the gap 110 by the horizontal pressure gradient generated in the immersion liquid in the space so that the gap 110 is filled with immersion liquid under a higher pressure than would be present if the barrier member 12 remained untilted. This tilt of the barrier member 12 can be maintained whilst the gap 110 is in the vicinity or under the space 11 or whilst the gap is adjacent or below the barrier member 12 or the tilt can be removed before the gap 110 is moved away from that position. The tilt can be applied at one time or can be increased gradually as the gap 110 approaches the barrier member 12 or space 11.

A further or alternative way in which the deterioration of the imaged quality can be reduced is to ensure that when the barrier member 12 and/or the space 11 is positioned above or adjacent a gap 110, a flow of immersion liquid in the proximity of the gap 110 in a direction away from the optical axis of the apparatus is encouraged i.e. a flow is generated or an existing flow is increased. The flow of immersion liquid or increase in flow of immersion liquid away from the optical axis of the projection system ensures that the bubbles which are formed at the gap 110 are prevented or reduced from entering the space 11 by the flow. A separate controller may be used for this task or the same controller as that used for normally controlling the direction of flow of immersion liquid can be used. The flow can be generated indirectly by varying the pressure in the immersion liquid.

U.S. patent application Ser. No. 11/098,615, filed 5 Apr. 2005 discloses how flow of immersion liquid across the space 11 can be promoted, particularly in relation to providing an input only around a fraction of the inner surface of the barrier member 12 and an output also around only a fraction of the barrier member 12 which fraction is positioned on the other side of the space 11 to the fraction of the inlet. This system may be used in an embodiment of the present invention.

In the embodiment of FIG. 8, an extra inlet 300 is provided on the bottom surface of the barrier member 12 which is positioned between the liquid removal device 20 and the recess 40. The inlet 300 is angled and/or shaped to direct immersion liquid exiting the inlet at least partially radially outwardly, such that the exiting immersion liquid is effective substantially to prevent or reduce bubbles formed in the immersion liquid at a position radially outwardly of the inlet (e.g. at the gap 110) from moving radially inwardly of the inlet towards the middle of the space 11 through which the projection beam radiates. In an embodiment, the inlet 300 is provided in a loop around the space 11 but may be only provided around a portion of the barrier member 12, for instance around a fraction of the periphery similar to the fraction of the periphery around which the outlet is provided in the barrier member of U.S. patent application Ser. No. 11/098,615.

A controller can also be used to provide the desired direction of flow by varying the rate of flow of immersion liquid through inlets/outlets around the periphery of the barrier member. This can be achieved by, for example, providing the liquid removal device 20 as individual discrete segments around the periphery of the barrier member 12 which are individually controllable. This is illustrated in FIG. 9. In a similar way, the inlet 13, recess 40 and gas knife 60 can also be provided in segments around the periphery of the barrier member 12 such that by controlling the various pressures and/or flow rates of immersion liquid and/or gas through those inlets and outlets the direction of flow of immersion liquid can be controlled to achieve the desired liquid flow as described above. The desired increase in flow is achievable by increasing the extraction in the region above the gap 110 for example.

If the barrier member is of the type where the direction of flow of immersion liquid in the space is substantially constant relative to the barrier member (e.g. the one disclosed in U.S. patent application Ser. No. 11/098,615 or U.S. patent application US 60/643,608, filed 14 Jan. 2005), it is possible to rotate the barrier member around the optical axis in a plane substantially perpendicular to the optical axis to ensure that the flow of immersion liquid in the proximity of the gap 110 is always radially outwardly i.e. in a direction away from the optical axis of the apparatus. This is illustrated in FIGS. 10a and 10b where it can be seen that at different positions on the substrate W close to the edge of the substrate W the barrier member 12 is rotated to ensure that direction 400 of flow of immersion liquid is radially outward.

In an embodiment, it may be advantageous to reduce or turn off the flow of gas through the gas knife 60 when the gas knife is positioned above the gap 110. This is because the high pressure of exiting gas can blow immersion liquid in the gap 110 out thereby inducing the formation of bubbles in the immersion liquid. Furthermore, reducing the velocity of gas exiting the gas knife is effective not to hinder filling of the gap 110 with immersion liquid under capillary forces. It is advantageous to not completely disrupt the flow of gas through the gas knife 60 but merely to reduce it. One way of conveniently providing a way of reducing the flow of gas through the gas knife is to form the final constriction through which gas exits the gas knife with the vertical walls of concentric rings or members which are moveable relative to each other. In this way the width of the gap can be varied and thereby the exiting velocity of gas without reducing the velocity to zero.

In a further or alternative embodiment, a barrier member 12 is provided which completely surrounds the whole of the substrate W. Thus, a seal is formed between the barrier member 12 and the substrate table WT during imaging of the substrate W and the substrate W is surrounded in a complete loop by the barrier member 12. In this embodiment the barrier member 12 is moveable in the XY plane relative to the projection system PL to the extent that is required for imaging the upper surface of the substrate W. In this embodiment relative movement of immersion liquid to the gap 110 does not occur to a great extent such that the formation of bubbles is avoided. The barrier member 12 can also be moved over the substrate W when, for example, a sensor needs to be imaged.

All of the above embodiments may be used in any combination or individually.

In European patent application publication no. EP 1420300 and U.S. patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a radiation beam onto a substrate or another object through a liquid which is confined to a space by a barrier member, the apparatus comprising a controller adapted to cause or increase movement of a part of the barrier member substantially parallel to the direction of the optical axis of the apparatus due to the part of the barrier member, the space or both, coming to be positioned above an edge of the substrate, or adjacent an edge of the substrate, or above an edge of the another object, or adjacent an edge of the another object.

2. The apparatus of claim 1, wherein the movement is additional to any movement of the barrier member made in response to other factors.

3. The apparatus of claim 1, wherein the movement is a cycle of moving the part in the direction towards the substrate or another object and then moving the part in the direction away from the substrate or another object.

4. The apparatus of claim 3, wherein the cycle is repeated while the part is positioned above or adjacent the edge.

5. The apparatus of claim 3, wherein the cycle has a cycle period of between 0.1 and 50 ms.

6. The apparatus of claim 1, wherein the movement is a movement from a normal position towards the substrate or another object to within 30 to 50 μm of the substrate or another object.

7. The apparatus of claim 3, wherein the movement is exclusively substantially parallel to the direction and is applied to the entire barrier member.

8. The apparatus of claim 3, wherein the movement is accomplished by tilting the barrier member.

9. The apparatus of claim 1, wherein the movement is a tilting of the barrier member such that the part is closer in the horizontal axis to the plane of a top surface of the substrate or another object than other parts.

10. The apparatus of claim 9, wherein the tilting occurs before the part or the space is above the edge.

11. The apparatus of claim 9, wherein the tilt of the barrier member remains until the part is no longer positioned above or adjacent the edge.

12. The apparatus of claim 9, wherein the tilt of the barrier member increases as the edge approaches, moves under, or both, the part.

13. The apparatus of claim 9, wherein the tilt, combined with any relative movement of the substrate or another object relative to the barrier member in a direction substantially perpendicular to the optical axis, is effective locally to increase the pressure of the liquid at the edge.

14. The apparatus of claim 1, wherein the movement is in a direction away from the substrate or another object to stabilize a meniscus of the liquid below the part.

15. The apparatus of claim 1, wherein, when the substrate is on a substrate table, there is a gap between the edge of the substrate and an adjacent edge of the substrate table.

16. A lithographic projection apparatus arranged to project a radiation beam onto a substrate through a liquid which is confined to a space by a barrier member, the barrier member comprising a contactless seal configured to extend between the barrier member and a substrate table configured to support the substrate and wherein the seal is configured to completely surround the substrate in a loop.

17. The apparatus of claim 16, wherein the barrier member is moveable relative to the substrate table and relative to a projection system configured to project the radiation beam.

18. The apparatus of claim 16, wherein, when the substrate is on the substrate table, there is a gap between an edge of the substrate and an adjacent edge of the substrate table.

19. A device manufacturing method using a lithographic projection apparatus comprising:
projecting a patterned beam of radiation through a liquid confined to a space by a barrier member onto a substrate;
moving the substrate such that part of the barrier member, the space, or both, is positioned above or adjacent an edge of the substrate; and
causing or increasing movement of the barrier member in a direction substantially parallel to an optical axis of the apparatus due to the barrier member, the space, or both, coming to be positioned above an edge of the substrate or adjacent an edge of the substrate.

20. The method of claim 19, wherein the movement is additional to any movement of the barrier member made in response to other factors.

21. The method of claim 19, wherein the movement is a cycle of moving the part in the direction towards the substrate or another object and then moving the part in the direction away from the substrate or another object.

22. The method of claim 21, wherein the cycle is repeated while the part is positioned above or adjacent the edge.

23. The method of claim 21, wherein the cycle has a cycle period of between 0.1 and 50 ms.

24. The method of claim 19, wherein the movement is a movement from a normal position towards the substrate or another object to within 30 to 50 μm of the substrate or another object.

25. The method of claim 19, wherein the movement is exclusively substantially parallel to the direction and is applied to the entire barrier member.

26. The method of claim 19, wherein the movement is accomplished by tilting the barrier member.

27. The method of claim 19, wherein the movement is a tilting of the barrier member such that the part is closer in the horizontal axis to the plane of a top surface of the substrate or another object than other parts.

28. The method of claim 27, wherein the tilting occurs before the part or the space is above the edge.

29. The method of claim 27, wherein the tilt of the barrier member remains until the part is no longer positioned above or adjacent the edge.

30. The method of claim 27, wherein the tilt of the barrier member increases as the edge approaches, moves under, or both, the part.

31. The method of claim 27, wherein the tilt, combined with any relative movement of the substrate or another object relative to the barrier member in a direction substantially perpendicular to the optical axis, is effective locally to increase the pressure of the liquid at the edge.

32. The method of claim 19, wherein the movement is in a direction away from the substrate or another object to stabilize a meniscus of the liquid below the part.

33. The method of claim 19, wherein there is a gap between the edge of the substrate and an adjacent edge of a substrate table holding the substrate.

* * * * *